US011057717B2

(12) United States Patent
Meng et al.

(10) Patent No.: US 11,057,717 B2
(45) Date of Patent: Jul. 6, 2021

(54) MEMS MICROPHONE

(71) Applicant: AAC Acoustic Technologies (Shenzhen) Co., Ltd., Shenzhen (CN)

(72) Inventors: Zhenkui Meng, Shenzhen (CN); Zhengyan Liu, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/708,378

(22) Filed: Dec. 9, 2019

(65) Prior Publication Data
US 2020/0213774 A1    Jul. 2, 2020

(30) Foreign Application Priority Data

Dec. 31, 2018    (CN) .......................... 201822278387.3

(51) Int. Cl.
*H04R 19/04*    (2006.01)
*H04R 7/16*    (2006.01)
*H04R 7/12*    (2006.01)
*B81B 3/00*    (2006.01)

(52) U.S. Cl.
CPC ............. *H04R 19/04* (2013.01); *B81B 3/001* (2013.01); *B81B 3/0021* (2013.01); *H04R 7/12* (2013.01); *H04R 7/16* (2013.01); *B81B 2201/0257* (2013.01); *B81B 2203/0127* (2013.01); *H04R 2201/003* (2013.01)

(58) Field of Classification Search
CPC . H04R 19/04; H04R 7/12; H04R 7/16; H04R 2201/003; H04R 19/005; B81B 3/0021; B81B 3/001; B81B 2203/0127; B81B 2201/0257
See application file for complete search history.

(56) References Cited

U.S. PATENT DOCUMENTS 9,438,979 B2 * 9/2016  Dehe ........................ H04R 1/08

FOREIGN PATENT DOCUMENTS

| CN | 103686570 B2 | 3/2014 |
| CN | 107835477 B2 | 3/2018 |

OTHER PUBLICATIONS

PCT search report dated Jan. 15, 2020 by SIPO in related PCT Patent Application No. PCT/CN2019/113317 (4 Pages).

* cited by examiner

*Primary Examiner* — Brian Ensey
(74) *Attorney, Agent, or Firm* — W&G Law Group LLP

(57) ABSTRACT

A MEMS microphone, includes: a base with a back cavity; and an electric capacitance system arranged on the base. The electric capacitance system includes a back plate, a first diaphragm opposite to and arranged on one side of the back plate, and a second diaphragm arranged on the other side of the back plate. The first diaphragm and the second diaphragm keeps a distance from the back plate for forming a first insulation gap and a second insulation gap respectively. The back plate includes a plurality of through holes; the first diaphragm and the second diaphragm are circular. The MEMS microphone further includes a first support piece between the first diaphragm and the second diaphragm through the through holes. Thus, the two diaphragms are not easy to adhere to the back plate.

7 Claims, 2 Drawing Sheets

MEMS MICROPHONE

FIELD OF THE PRESENT INVENTION

The present invention relates to the technical field of microphones, in particular to a MEMS microphone with a double-diaphragm configuration.

DESCRIPTION OF RELATED ART

MEMS (micro electro mechanical system) technology has been widely used in recent years. It uses advanced semiconductor manufacturing technology to realize the mass manufacturing of sensors, actuators and other devices. Compared with the corresponding traditional devices, MEMS devices have obvious advantages in volume, power consumption, weight and price. In the market, the main application examples of MEMS devices include pressure sensors, accelerometers and silicon microphones.

The silicon microphone manufactured by MEMS technology has considerable advantages in ECM miniaturization, performance, reliability, environmental tolerance, cost and mass production capacity. It quickly occupies the market of mobile phone, PDA, MP3, hearing aid and other consumer electronic products. The silicon microphone made by MEMS technology usually has a movable diaphragm arranged parallel to the solid-state back plate, which forms a variable capacitor with back plate. The diaphragm moves in response to the incident sound energy to change the variable capacitance, and thereby an electrical signal is generated to represent the incident sound energy.

With the development of capacitive micro silicon microphone technology, it is required that the size of silicon microphone should be smaller, the cost is lower and the reliability is higher. However, the size of silicon microphone becomes small, it will cause lower sensitivity and signal-to-noise ratio. How to further improve the signal-to-noise ratio of silicon microphone is an urgent problem to be solved currently.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present invention.

DETAILED DESCRIPTION OF THE EXEMPLARY EMBODIMENT

The present invention will hereinafter be described in detail with reference to an exemplary embodiment. To make the technical problems to be solved, technical solutions and beneficial effects of the present invention more apparent, the present invention is described in further detail together with the figures and the embodiment. It should be understood the specific embodiment described hereby is only to explain the invention, not intended to limit the invention.

Figure 1:
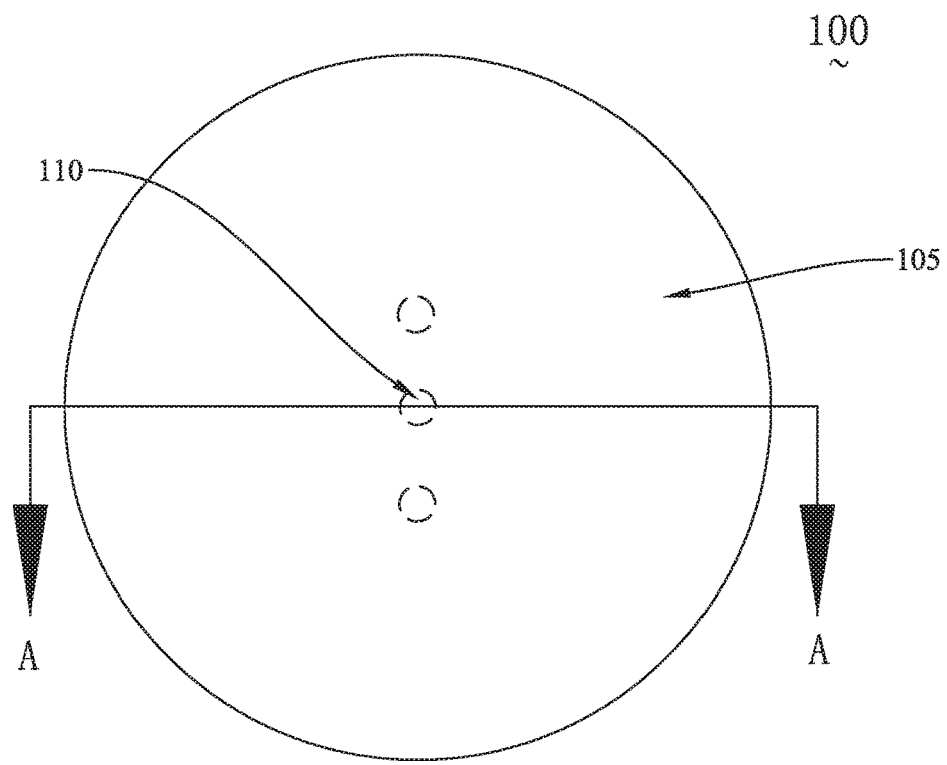
FIG. 1 is a top view of a MEMS microphone of the embodiment of the present invention.
Figure 2:
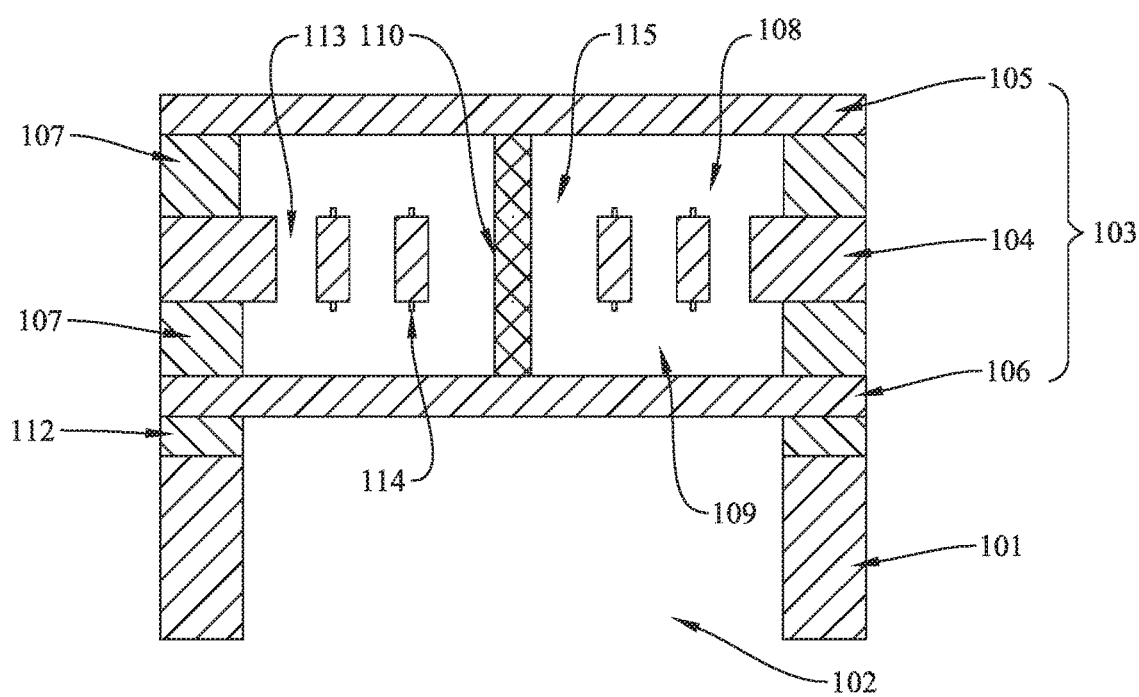
FIG. 2 is a cross-sectional view of the MEMS microphone taken along line A-A in FIG. 1.

As shown in FIGS. 1 and 2, the MEMS microphone 100 includes a base 101 and an electric capacitance system 103 arranged on the base 101 and connected to the base 101 in isolation.

The material of the base 101 is preferably a semiconductor material, such as silicon, which has a back cavity 102, an upper surface and a lower surface opposite to the upper surface. The upper surface of the base 101 is provided with an insulation layer 112, the back cavity 102 passes through the insulation layer 112, and the upper and lower surfaces of the base 101. Wherein the back cavity 102 can be formed through corrosion by a bulk-silicon process and dry method.

The electric capacitance system 103 includes a back plate 104 and a first diaphragm 105 and a second diaphragm 106 which are opposite to the back plate 104 and are respectively arranged on both sides of the back plate 104. The first diaphragm 105 and the back plate 104, and the second diaphragm 106 and the back plate 104 are both provided with an insulator 107 for separating the first diaphragm 105 from the back plate 104 a certain distance for forming a first insulation gap 108, and separates the second diaphragm 106 from the back plate 104 a certain distance, and a second insulation gap 109 are formed. The second diaphragm 106 is connected to the base 101 by an insulation layer 112. The back plate 104 has a number of through holes 113. The through hole 113 penetrates the first insulation gap 108 and the second insulating gap 109 to form an inner cavity 115. When the MEMS microphone is powered on, the first diaphragm 105 and the back plate 104, the second diaphragm 106 and the back plate 104 will be charged with opposite polarity, thus forming a capacitance. When the first diaphragm 105 and the second diaphragm 106 vibrate under the action of sound waves, the distance between the back plate 104 and the first diaphragm 105 and the second diaphragm 106 will change, which will cause the capacitance of the capacitance system to change The acoustic signal is transformed into electrical signal to realize the corresponding function of microphone.

In this embodiment, the first diaphragm 105 and the second diaphragm 106 are circular or elliptical, and the first supporting component 110 is arranged between the bottom surface of the first diaphragm 105 and the surface of the second diaphragm 106.

Preferably, the first supporting component 110 is arranged at the bottom surface of the first diaphragm 105 and the top surface of the second diaphragm 106, that is, one end of the first supporting component 110 is connected to the circle center of the first diaphragm 105, and the other end is connected to the circle center of the second diaphragm 106.

The first supporting component 110 is, for example, a support column structure.

Figure 3:
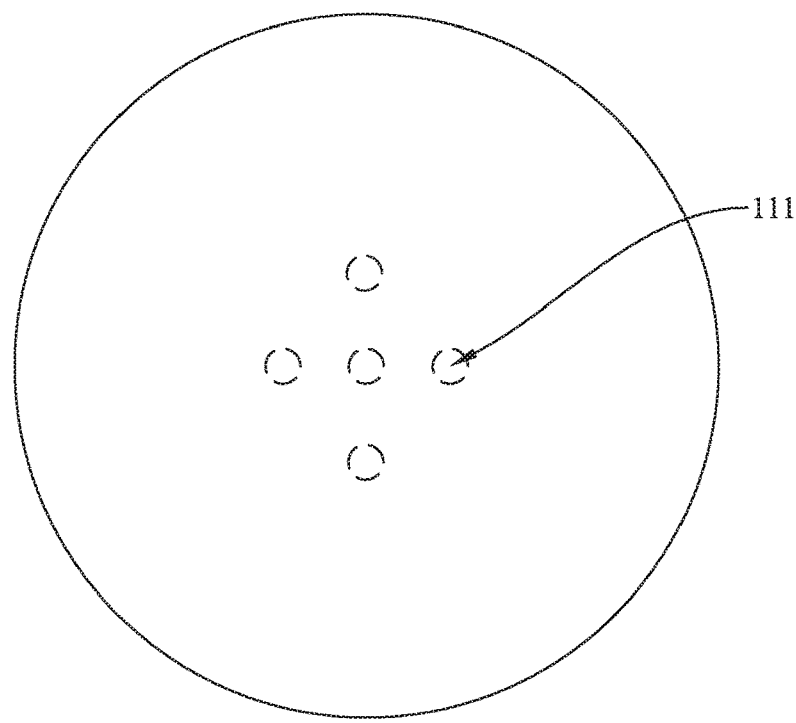
FIG. 3 is an illustration showing an array of insulating supporting components of the MEMS microphone.

Preferably, it can also include at least two second supporting component 111, at least two of the supporting components 111 are uniformly arranged on the circumference with the first supporting component 110 as the circle center, as shown in FIG. 3.

The first supporting component 110 and/or the second supporting component 111 are arranged to fixedly connect the first diaphragm 105 and the second diaphragm 106 through the through hole 113 of the backplane 104; that is, the first supporting component 110 and/or the second supporting component 111 are not in contact with the back plate 104 and are not affected by the back plate 104.

The first supporting component 110 and/or the second supporting component 111 may be formed on the top surface of the second diaphragm 106 by various preparation techniques, such as physical vapor deposition, electrochemical deposition, chemical vapor deposition and molecular beam epitaxy.

The first supporting component 110 and/or the second supporting component 111 may be composed of or may include a semiconductor material such as silicon. For example, germanium, SiGe, silicon carbide, gallium nitride, indium, indium gallium nitride, indium gallium arsenide, indium gallium zinc oxide or other element and/or compound semiconductor (e.g., III-V compound semiconductor or II-VI compound semiconductor such as gallium arsenide or indium phosphide, or ternary compound semiconductor or quaternary compound semiconductor). It can also be constituted by or comprise at least one of the followings: metal, dielectric material, piezoelectric material, piezo-resistive material and ferroelectric material.

According to various embodiments, the first supporting component 110 and/or the second supporting component 111 may be integrally formed with the first diaphragm 105 and the second diaphragm 106, respectively.

According to various embodiments, the first diaphragm 105, the second diaphragm 106 and the first supporting component 110 and/or the second supporting component 111 may form an integrated structure of the same material (e.g. silicon).

Figure 4:
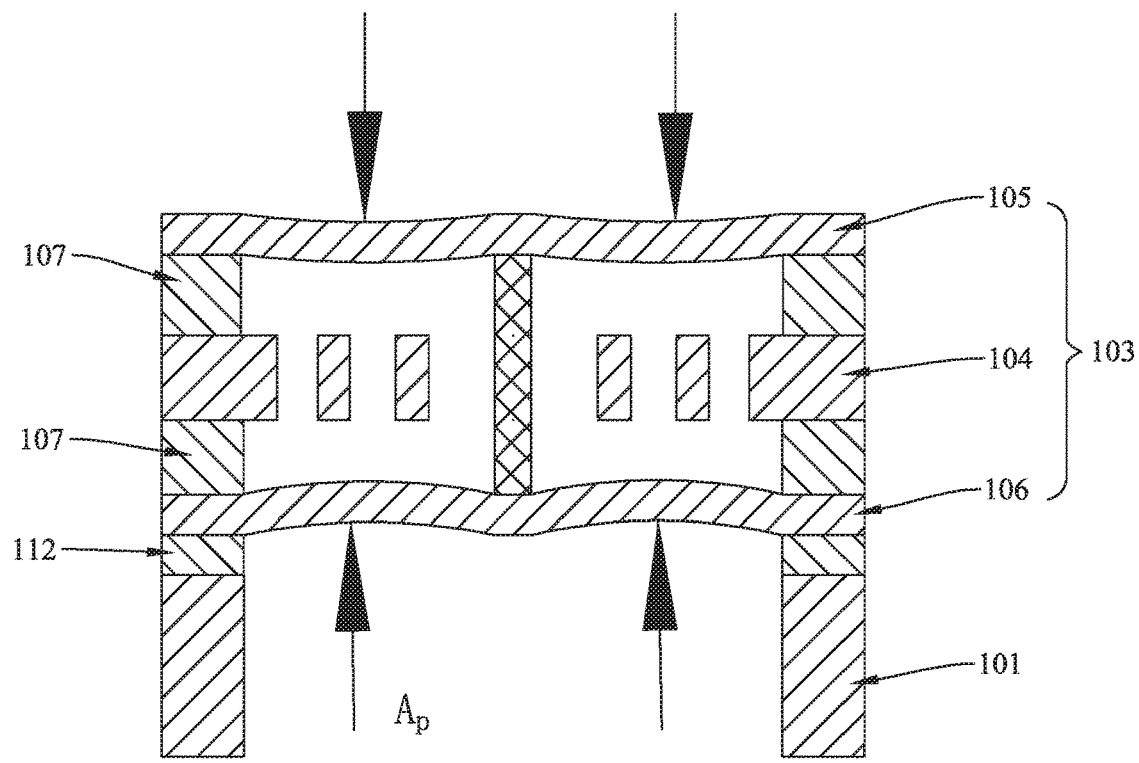
FIG. 4 is a schematic diagram of a deflection of the MEMS microphone in the embodiment of the present invention due to the environmental pressure.

As shown in FIG. 4, due to the vacuum and/or low pressure in the cavity 115 composed of the insulation gaps 108 and 109, the first diaphragm 105 and the second diaphragm 106 will deflect towards the cavity due to the loading of the environmental pressure AP, and unnecessary deflection can be avoided as much as possible through the first supporting component 110 and/or the second supporting component 111, but it should also be noted that too many support structures may also cause the sensitivity lowered. Therefore, the present invention preferably sets the first supporting component 110 and/or the second supporting component 111 in the central area of the first diaphragm 105 and the second diaphragm 106.

In addition, the two diaphragm structures are mechanically coupled together, and the displacement and/or deflection of either diaphragm can cause the proportional displacement and/or deflection of the other diaphragm structure, making the two diaphragm structures basically the same structure.

In addition, in order to prevent each vibration unit from adsorbing with the back plate 104 in the process of vibration, several insulation bumps 114 can be set on the surface of the back plate 104 close to the first insulation gap 108 and the second insulation gap 109 respectively, and the insulation bumps 114 will not be charged when the MEMS microphone is powered on, so its function is only to prevent each vibration unit from sticking with the back plate in the process of vibration.

It is to be understood, however, that even though numerous characteristics and advantages of the present exemplary embodiments have been set forth in the foregoing description, together with details of the structures and functions of the embodiments, the invention is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone, including:
a base with a back cavity;
an electric capacitance system arranged on the base, the electric capacitance system including a back plate, a first diaphragm opposite to and arranged on one side of the back plate, and a second diaphragm arranged on the other side of the back plate; the first diaphragm and the second diaphragm being keeping a distance from the back plate for forming a first insulation gap and a second insulation gap respectively; wherein
the back plate includes a plurality of through holes; the first diaphragm and the second diaphragm are circular;
the MEMS microphone further includes a first support piece arranged between the first diaphragm and the second diaphragm through the through holes, one end of the first support piece is connected to the center of the first diaphragm, and the other end is connected to the circle center of the second diaphragm.

2. The MEMS microphone in claim 1 further comprising at least two second supports arranged between the first diaphragm and the second diaphragm through the through holes, wherein the at least two second supports are uniformly arranged on the circumference with the first support as the circle center.

3. The MEMS microphone in claim 2, wherein the first supporting component and/or the second supporting component are cylindrical structures.

4. The MEMS microphone in claim 3, wherein the first supporting component and/or the second supporting component are cylindrical structures; the first supporting component and/or the second supporting component do not contact the backplane.

5. The MEMS microphone in claim 1, wherein the upper and lower surfaces of the backplane includes a number of bumps for preventing the first diaphragm and the second diaphragm from adhering to the backplane.

6. The MEMS microphone in claim 1, further comprising an insulating layer arranged on the surface of the base, and the electric capacitance system is connected with the base through the insulating layer.

7. The MEMS microphone in claim 6, wherein the back cavity penetrates the base and the insulating layer.

* * * * *